United States Patent
Yamada

(10) Patent No.: US 8,994,443 B2
(45) Date of Patent: Mar. 31, 2015

(54) BIDIRECTIONAL SWITCH AND SWITCH CIRCUIT USING THE BIDIRECTIONAL SWITCH

(75) Inventor: Kouichi Yamada, Gifu-ken (JP)

(73) Assignee: Semiconductor Components Industries, LLC, Phoenix, AZ (US)

( * ) Notice: Subject to any disclaimer, the term of this patent is extended or adjusted under 35 U.S.C. 154(b) by 81 days.

(21) Appl. No.: 13/221,523

(22) Filed: Aug. 30, 2011

(65) Prior Publication Data

US 2012/0049931 A1    Mar. 1, 2012

(30) Foreign Application Priority Data

Aug. 31, 2010   (JP) ................................. 2010-194506

(51) Int. Cl.
  *H03K 17/687*   (2006.01)
  *H03K 17/06*   (2006.01)
(52) U.S. Cl.
  CPC ...... *H03K 17/063* (2013.01); *H03K 2217/0054* (2013.01)
  USPC .......................................... 327/434; 327/427
(58) Field of Classification Search
  USPC ................................................. 327/427–437
  See application file for complete search history.

(56) References Cited

U.S. PATENT DOCUMENTS

| 6,462,611 | B2* | 10/2002 | Shigehara et al. | 327/534 |
| 7,602,229 | B2* | 10/2009 | Tolle et al. | 327/440 |
| 7,930,644 | B2* | 4/2011 | Silva et al. | 715/771 |

FOREIGN PATENT DOCUMENTS

| JP | 05-327436 A | 12/1993 |
| JP | 2006-108567 A | 4/2006 |
| JP | 2010-166793 | 7/2010 |

OTHER PUBLICATIONS

Japanese Office Action issued in corresponding Japanese Application No. 2010-194506, dated Nov. 12, 2013, with English translation.

* cited by examiner

Primary Examiner — Diana J Cheng

(57) ABSTRACT

In a bidirectional switch using a metal-oxide-semiconductor field-effect transistor (MOSFET), the source terminal and the backgate terminal of the MOSFET are connected to each other via a transfer gate. A switch may be used between the connection point of the backgate terminal and the transfer gate of the MOSFET and the ground potential (where the MOSFET is an n-channel type) or supply potential (where the MOSFET is a p-channel type).

20 Claims, 4 Drawing Sheets

BIDIRECTIONAL SWITCH AND SWITCH CIRCUIT USING THE BIDIRECTIONAL SWITCH

This application is based upon and claims the benefit of priority from the prior Japanese Patent Application No. 2010-194506, filed on Aug. 31, 2010, the entire content of which is incorporated herein by reference.

BACKGROUND OF THE INVENTION

1. Field of the Invention

The present invention relates to a bidirectional switch, which requires a high breakdown voltage, and a switch circuit using said bidirectional switch.

2. Description of the Related Art

Generally, a switch using a MOSFET (metal-oxide-semiconductor field-effect transistor) is preferably such that a voltage between source and backgate (source-backgate voltage) be constant in order that the impedance does not vary depending on an input level. In order to make the source-backgate voltage constant or fixed, a source terminal and a backgate terminal (hereinafter sometimes referred to as "body terminal" and "bulk terminal", respectively) are shorted, so that a parasitic diode made by a p-n junction is formed between the source and the drain. Accordingly, in n-channel MOSFETs, the current flows through the parasitic diode from a source side to a drain side in the event that the gate is turned off. As a result, the signal from the source side to the drain side cannot be blocked off.

In view of the above, used is a generally-known method where two MOSFETs are connected in series with each other so that the directions of the parasitic diodes become opposite in order to enable the switching of signals in both directions.

However, in the bidirectional switch inserted into the power supply line that transmits electricity at high voltage, the size of the two MOSFETs must be made larger to improve the high breakdown voltage characteristic. Use of the two large-size MOSFETs increases the total circuit area of the bidirectional switch.

SUMMARY OF THE INVENTION

A bidirectional switch according to one embodiment of the present invention is a bidirectional switch using a metal-oxide-semiconductor field-effect transistor (MOSFET), and a source terminal and a backgate terminal of the MOSFET are connected to each other via a transfer gate. The bidirectional switch may be inserted into a power supply line, and power supplied through the power supply line may be turned on and off.

Another embodiment of the present invention relates to a switch circuit. The switch circuit is a switch circuit to be mounted in a device having a supply terminal that allows insertion of a terminal of a cable capable of supplying power or insertion of a terminal of a cable dedicated to the transmission of audio signals in a shared manner, wherein a signal line from the supply terminal is branched into a plurality of lines, and the respective plurality of lines are connected to one end of a power switch and one end of at least one audio switch; wherein a signal line from the other end of the power switch is connected to a power circuit; wherein a signal line from the at least one audio switch is connected to respective audio circuits; and wherein the at least one audio switch is constructed of the above-described bidirectional switch.

BRIEF DESCRIPTION OF THE DRAWINGS

Embodiments will now be described by way of examples only, with reference to the accompanying drawings which are meant to be exemplary, not limiting, and wherein like elements are numbered alike in several Figures in which.

DETAILED DESCRIPTION OF THE INVENTION

The invention will now be described by reference to the preferred embodiments. This does not intend to limit the scope of the present invention, but to exemplify the invention.

Figure 1A:
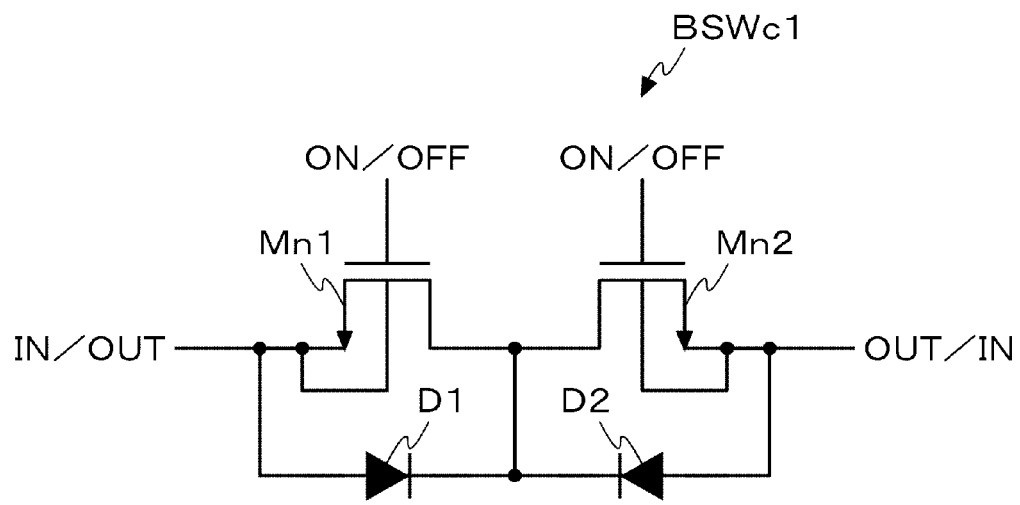
FIGS. 1A and 1B are circuit diagrams showing bidirectional switches that are to be compared with switch circuits according to embodiments of the present invention.
Figure 1B:
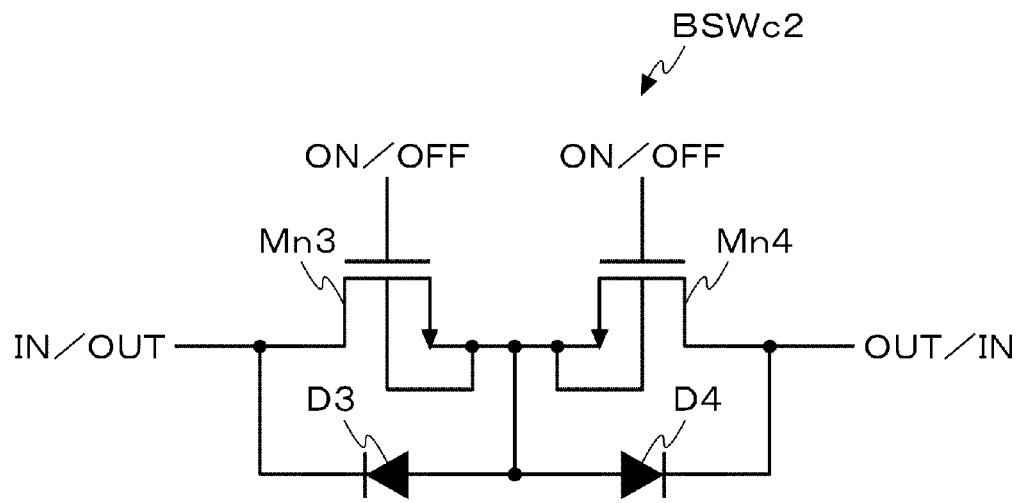

FIGS. 1A and 1B are circuit diagrams of bidirectional switches that are to be compared with switch circuits according to embodiments of the present invention. In an n-channel MOSFET, as a source voltage rises, a threshold voltage Vt also rises, thereby increasing a source-drain impedance. In a signal, such as an analog audio signal, having amplitude on the positive side and the negative side with 0 V (ground potential) as the base point, the positive amplitude is more likely to be distorted, which is a main cause of the breakdown of symmetry of amplitude.

A configuration to counter this is employed as follows. That is, it is conceivable that a backgate terminal and a source terminal are connected to each other in order to suppress the variation in the threshold voltage Vt by fixing the backgate-source voltage. However, connecting the backgate terminal to the source terminal results in the formation of a parasitic diode between the source and the drain. Since this parasitic diode is formed in the forward direction from the source to the drain, the input signals from the source toward the drain cannot be blocked off. Thus, the MOSFET in which the backgate terminal and the source terminal are simply connected to each other cannot be used to in application where the current from the source should be blocked.

Based on the above-described conditions, a description will now be given of a bidirectional switch BSWc1 of a first comparative example shown in FIG. 1A. The bidirectional switch BSWc1 is constructed by connecting two MOSFETs in series to make it possible to block off the input signals from the source toward the drain, that is, to enable the use of this switch as a bidirectional switch.

In the first comparative example, the bidirectional switch BSWc1 is constructed by connecting a drain terminal of a first n-channel MOSFET (Mn1) to a drain terminal of a second n-channel MOSFET (Mn2). A backgate terminal and a source terminal of the first n-channel MOSFET (Mn1) are connected to each other. This results in the formation of a first parasitic diode D1 between the source terminal and the drain terminal of the first n-channel MOSFET (Mn1). The first parasitic diode D1 will have an anode on a source terminal side thereof and a cathode on a drain terminal side thereof.

If, the gate-source voltage of the first n-channel MOSFET (Mn1) is also to be fixed, the gate terminal and the source terminal may be connected to each other (not shown here). In such a case, capacitance or other elements may be inserted between the gate terminal and the source terminal.

The second n-channel MOSFET (Mn2) is of the same connection configuration as the first n-channel MOSFET (Mn1). Therefore, a second parasitic diode D2 is formed between the source terminal and the drain terminal of the second n-channel MOSFET (Mn2).

Though not shown, a p-channel MOSFET may be inserted between the connection point of the drain terminal of the first n-channel MOSFET (Mn1) and the drain terminal of the second n-channel MOSFET (Mn2) and the supply potential. In this case, when the bidirectional switch BSWc1 is turned off, the connection point can be clamped to the supply potential.

When the bidirectional switch BSWc1 is controlled to be on, an on-signal (high-level voltage) is inputted to the respective gate terminals of the first n-channel MOSFET (Mn1) and the second n-channel MOSFET (Mn2). On the other hand, when the bidirectional switch BSWc1 is controlled to be off, an off-signal (low-level voltage) is inputted to the respective gate terminals of the first n-channel MOSFET (Mn1) and the second n-channel MOSFET (Mn2).

The bidirectional switch BSWc1 of the first comparative example is of such configuration that the cathodes of the first parasitic diode D1 and the second parasitic diode D2 face each other. Therefore, there is no flow of electric current across the bidirectional switch BSWc1 in either direction through the first parasitic diode D1 and the second parasitic diode D2 when the first n-channel MOSFET (Mn1) and the second n-channel MOSFET (Mn2) are in the off state. In other words, the bidirectional switch BSWc1 can be completely turned off.

A description is now given of a bidirectional switch BSWc2 shown in FIG. 1B, according to a second comparative example. In the second comparative example, too, the bidirectional switch BSWc2 is configured by connecting two MOSFETs in series with each other.

In the second comparative example, the bidirectional switch BSWc2 is constructed by connecting a source terminal of a third n-channel MOSFET (Mn3) to a source terminal of a fourth n-channel MOSFET (Mn4). The backgate terminal and the source terminal of the third n-channel MOSFET (Mn3) are connected to each other. This results in the formation of a third parasitic diode D3 between the source terminal and the drain terminal of the third n-channel MOSFET (Mn3). The third parasitic diode D3 will have an anode on a source terminal side thereof and a cathode on a drain terminal side thereof.

A fourth n-channel MOSFET (Mn4) is of the same connection configuration as the third n-channel MOSFET (Mn3). Therefore, a fourth parasitic diode D4 is formed between a source terminal and a drain terminal of the fourth n-channel MOSFET (Mn4).

Though not shown, an n-channel MOSFET may be inserted between the connection point of the source terminal of the third n-channel MOSFET (Mn3) and the source terminal of the fourth n-channel MOSFET (Mn4) and the ground potential. In this case, when the bidirectional switch BSWc2 is turned off, the connection point can be clamped to the ground potential.

When the bidirectional switch BSWc2 is controlled to be on, an on-signal (high-level voltage) is inputted to the respective gate terminals of the third n-channel MOSFET (Mn3) and the fourth n-channel MOSFET (Mn4). On the other hand, when the bidirectional switch BSWc2 is controlled to be off, an off-signal (low-level voltage) is inputted to the respective gate terminals of the third n-channel MOSFET (Mn3) and the fourth n-channel MOSFET (Mn4).

The bidirectional switch BSWc2 of the second comparative example is of such configuration that the anodes of the third parasitic diode D3 and the fourth parasitic diode D4 face each other. Therefore, there is no flow of electric current across the bidirectional switch BSWc2 in either direction through the third parasitic diode D3 and the fourth parasitic diode D4 when the third n-channel MOSFET (Mn3) and the fourth n-channel MOSFET (Mn4) are in the off state. In other words, the bidirectional switch BSWc2 can be completely turned off.

For a transistor switch inserted into the power supply line, a transistor having the high breakdown voltage characteristic is required in case of accidents such as instantaneous power failure and surge currents. That is, a large-size transistor must be used (more specifically, the transistor must be have a larger gate width (GW) and a larger diffusion layer). Use of two such transistors connected to each other leads to a significant increase in the circuit area.

Figure 2:
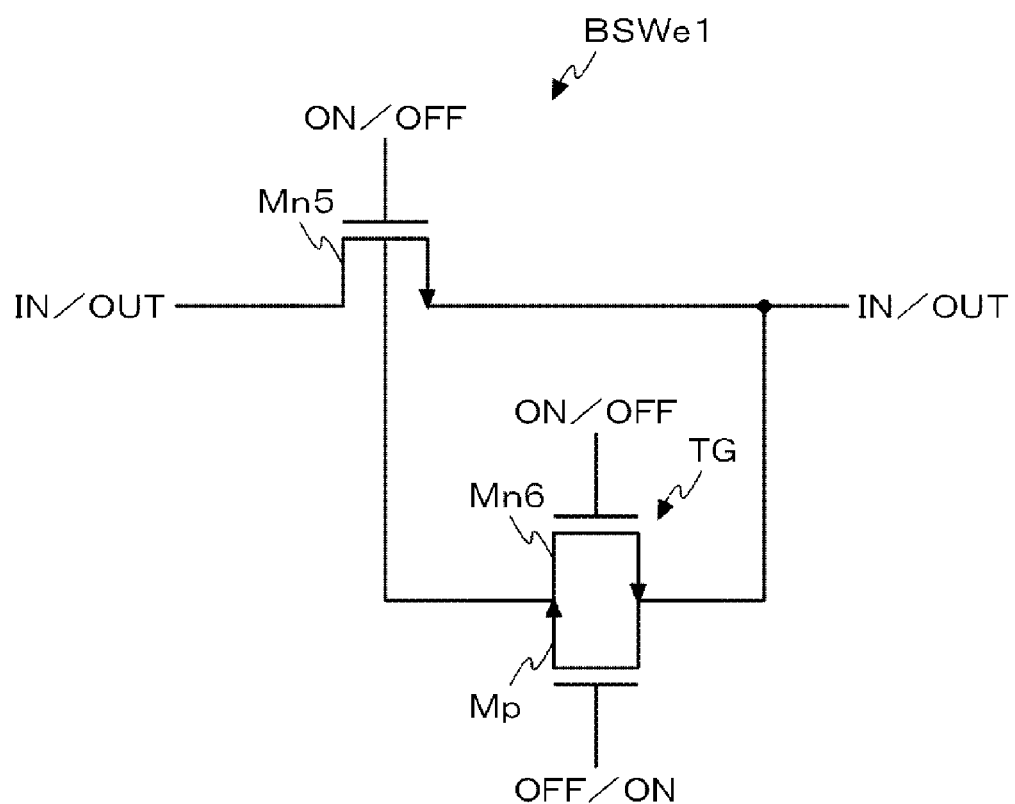
FIG. 2 is a circuit diagram showing a bidirectional switch according to a first embodiment of the present invention.

FIG. 2 is a circuit diagram showing a bidirectional switch BSWe1 according to a first embodiment of the present invention. The bidirectional switch BSWe1 according to the first embodiment is provided with the same functions as those of the bidirectional switches BSWc1 and BSWc2 of the first and second comparative examples, and only a single unit of such a large-size transistor constitutes the bidirectional switch BSWe1.

In the first embodiment, a source terminal and a backgate terminal of a fifth n-channel MOSFET (Mn5) is connected via a transfer gate TG. The transfer gate TG is constituted by a complementary switch. The complementary switch is configured by a sixth n-channel MOSFET (Mn6) and a p-channel MOSFET Mp in combination. The characteristics of increase in on-resistance of n-channel MOSFET relative to an input voltage is opposite to the characteristics of increase in on-resistance of p-channel MOSFET relative thereto. Thus, the complementary switch can have a wide input voltage range.

A source terminal of the sixth n-channel MOSFET (Mn6) and a drain terminal of the p-channel MOSFET Mp are connected to each other, and the connection point of the source terminal of the sixth n-channel MOSFET (Mn6) and the drain terminal of the p-channel MOSFET Mp and the source terminal of the fifth n-channel MOSFET (Mn5) is connected to each other. A drain terminal of the sixth n-channel MOSFET (Mn6) and a source terminal of the p-channel MOSFET Mp are connected to each other, and the connection point of the drain terminal of the sixth n-channel MOSFET (Mn6) and the source terminal of the p-channel MOSFET Mp and the backgate terminal of the fifth n-channel MOSFET (Mn5) is connected to each other.

A complementary switching signal is inputted to a gate terminal of the sixth n-channel MOSFET (Mn6) and a gate terminal of the p-channel MOSFET Mp. That is, when an on-signal (high-level voltage) is inputted to the gate terminal of the sixth n-channel MOSFET (Mn6), an off-signal (high-level voltage) is inputted to the gate terminal of the p-channel MOSFET Mp. And when an off-signal (low-level voltage) is inputted to the gate terminal of the sixth n-channel MOSFET (Mn6), an on-signal (low-level voltage) is inputted to the gate terminal of the p-channel MOSFET Mp.

When the bidirectional switch BSWe1 of the first embodiment is controlled to be on, an on-signal (high-level voltage) is inputted to the gate terminal of the fifth n-channel MOSFET (Mn5) and an on-signal is inputted to the transfer gate TG. More specifically, as described already, an on-signal (high-level voltage) is inputted to the gate terminal of the sixth n-channel MOSFET (Mn6), whereas an off-signal (high-level voltage) is inputted to the gate terminal of the p-channel MOSFET Mp.

On the other hand, when the bidirectional switch BSWe1 is controlled to be off, an off-signal (low-level voltage) is inputted to the gate terminal of the fifth n-channel MOSFET (Mn5) and an off-signal is inputted to the transfer gate TG.

The transfer gate TG is an element that directly passes the input signals when the transfer gate TG is turned on, and blocks the input signals when the transfer gate TG is turned off. Thus, when the bidirectional switch BSWe1 is controlled to be on, a source voltage of the fifth n-channel MOSFET (Mn5) is directly applied to the backgate terminal of the fifth n-channel MOSGET (Mn5) regardless of whether the source voltage thereof is positive or negative. On the other hand, when the bidirectional switch BSWe1 is controlled to be off, the source terminal and the backgate terminal of the fifth n-channel MOSFET (Mn5) are electrically blocked. Thus, the parasitic diode is not formed between the source terminal and the drain terminal of the fifth n-channel MOSFET (Mn5) when the bidirectional switch BSWe1 is controlled to be off.

Figure 3:
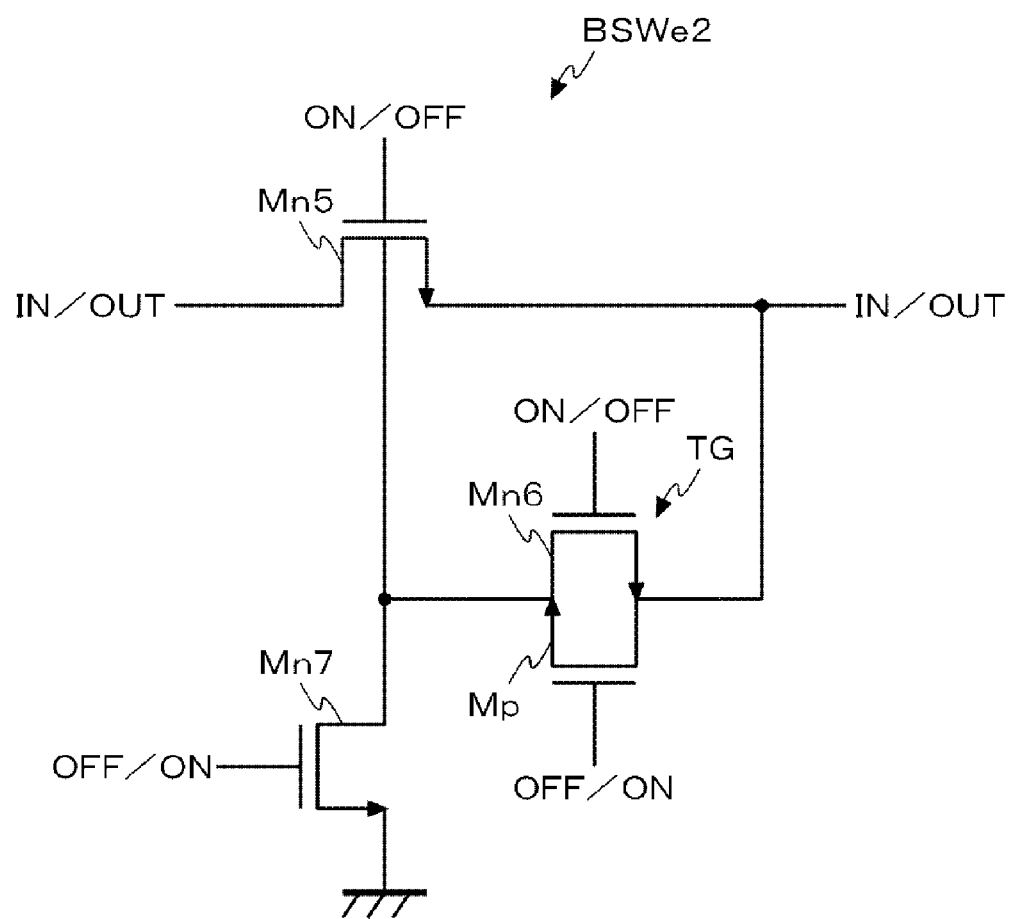
FIG. 3 is a circuit diagram showing a bidirectional switch according to a second embodiment of the present invention.

FIG. 3 is a circuit diagram showing a bidirectional switch BSWe2 according to a second embodiment of the present invention. The bidirectional switch BSWe2 of the second embodiment is configured such that a seventh n-channel MOSFETM (Mn7) functioning as a switch is added to the bidirectional switch BSWe1 of the first embodiment. The seventh n-channel MOSFET (Mn7) is connected between the connection point of the backgate terminal of the fifth n-channel MOSFET (Mn5) and the transfer gate TG and the ground potential. More specifically, a source terminal of the seventh n-channel MOSFETM (Mn7) is connected to the ground potential, a drain terminal thereof is connected to said connection point, and a gate terminal thereof receives switching signals.

When the bidirectional switch BSWe2 of the second embodiment is controlled to be on, an on-signal (high-level voltage) is inputted to the gate terminal of the fifth n-channel MOSFET (Mn5), an on-signal is inputted to the transfer gate TG, and an off-signal (low-level voltage) is inputted to the gate terminal of the seventh n-channel MOSFETM (Mn7).

On the other hand, when the bidirectional switch BSWe2 is controlled to be off, an off-signal (low-level voltage) is inputted to the gate terminal of the fifth n-channel MOSFET (Mn5), an off-signal is inputted to the transfer gate TG, and an on-signal (high-level voltage) is inputted to the gate terminal of the seventh n-channel MOSFETM (Mn7). As a result, the potential of the backgate terminal of the fifth n-channel MOSFET (Mn5) is controlled to be ground potential.

If a p-channel MOSFET is used in place of the fifth n-channel MOSFET (Mn5), another p-channel MOSFET (not shown) functioning as a switch is connected between the connection point of the backgate terminal of the p-channel MOSFET and the transfer gate TG and the supply potential. In such a case, when the p-channel MOSFET used instead of the fifth n-channel MOSFET (Mn5) is controlled to be off, the another p-channel MOSFET connected between the connection point and the supply potential is controlled to be on and the potential of the backgate terminal of the p-channel MOSFET used instead of the fifth n-channel MOSFET (Mn5) is controlled to be supply potential.

According to the first and second embodiment as described above, provision of the transfer gate in between the source terminal and the backgate terminal of MOSFET enables the downsizing of a bidirectional switch having the high breakdown voltage characteristic. That is, two large-size MOSFETs can be reduced to a single unit of MOSEFT while the similar functions to the bidirectional switches BSWc1 and BSWc2 of the first and second comparative examples are remained intact. Note that the size of MOSFET used for the transfer gate needs not be large because the signals to be handled are audio signals and fast speed is not required.

Also, when the bidirectional switch BSWe2 of the second embodiment is in the off state, the voltage of the backgate terminal of the fifth n-channel MOSFET (Mn5) can be clamped to the ground potential. Hence, the bidirectional switch BSWc2 can be reliably turned off.

Figure 4:
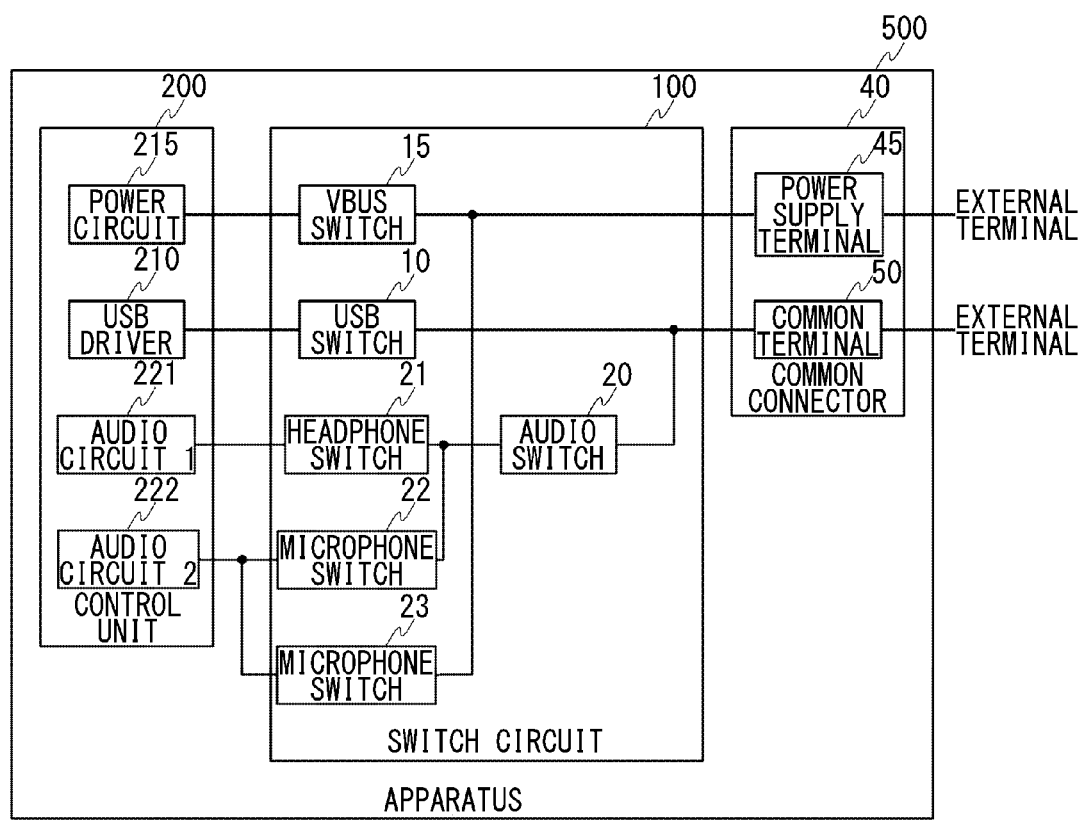
FIG. 4 shows an example of the application of bidirectional switches according to first and second embodiments of the present invention.

FIG. 4 shows an example of the application of bidirectional switches BSWe1 and BSWe2 according to the first and second embodiments of the present invention. In this application example, a mobile phone is assumed as an apparatus 500. The apparatus 500 includes a control unit 200, a switch circuit 100, and a common connector 40. The control unit 200 includes a power circuit 215, a USB driver 210, an audio circuit 1 (221), and an audio circuit 2 (222). The switch circuit 100 includes a VBUS switch 15, a UBS switch 10, an audio switch 20, a headphone switch 21, a microphone switch 22, and a microphone switch 23. The common connector 40 includes a supply terminal 45 and a common terminal (port) 50.

In this application example, a supply terminal of a USB connector will be used as an example of the supply terminal 45, and the D− terminal and D+ terminal of the USB connector will be used as examples of the common terminal 50. In addition to these terminals, the USB connector has a ground terminal, thus having a total of four pins. Also, a micro USB connector, which is further provided with an ID terminal, has a total of five pins. The ID terminal can also be used as the common terminal 50.

The supply terminal 45 allows the insertion of a terminal of a cable capable of supplying power (e.g., terminal of a USB cable) or the insertion of a terminal of a cable dedicated to the transmission of audio signals (terminal of the microphone cable in FIG. 4) in a shared manner. The common terminal 50 allows the insertion of a terminal of a cable for transmission of high-frequency signals (e.g., terminal of the USB cable) or the insertion of a terminal of a cable dedicated to the transmission of audio signals (e.g., terminal of a headphone cable) in a shared manner.

A signal line from the supply terminal 45 is branched into a plurality of lines (two lines in the case of FIG. 4), and the respective plurality of lines (two lines in the case of FIG. 4) are connected to one ends of the VBUS switch 15 and the microphone switch 23. A signal line from the other end of the VBUS switch 15 is connected to the power circuit 215. A signal line from the other end of the microphone switch 23 is connected to the audio circuit 2 (222). A high voltage of 25 to 28 V is applied to the power circuit 215 from an external device. Accordingly, the microphone switch 23 sharing the signal line with the power circuit 215 needs to have a high breakdown voltage characteristic. Thus, the bidirectional switches BSWe1 and BSWe2 of the first and second embodiments are used for the microphone switch 23. The bidirectional switches BSWe1 and BSWe2 of the first and second embodiments, which meet the high breakdown voltage requirement and is of small size, are suitable for the switching of analog audio signals.

Where the power circuit 215 receives the supply of power from the external device only, there is no need to use a bidirectional switch. However, if the power is also supplied to the external device from the power circuit 215, a bidirectional switch will be required. In the latter case, the bidirectional switches BSWe1 and BSWe2 of the first and second embodiments may be used for the VBUS switch 15.

If the headphone switch is used in place of the microphone switch 23, the bidirectional switches BSWe1 and BSWe2 of the first and second embodiments may be similarly used for the headphone switch.

The switch circuit 100 is provided with a high-frequency signal switch capable of switching between passage and no passage of high-frequency signals and an audio signal switch (excluding the microphone switch 23) dedicated to switching between passage and no passage of audio signals, in addition to the VBUS switch 15.

For the switching of high-frequency signals, the load capacity of transistors needs be as small as practicable to suppress the dullness and unsharpness of rising edges. On the other hand, for the switching of analog audio signals, it is necessary that a transistor of low on-resistance of about several ohms be used and therefore the size of the transistor must be large. More specifically, the transistor must be of such design as to have a large gate width (GW), namely, a large diffusion layer.

The common terminal 50 allows the insertion of a terminal of a USB cable, a terminal of a headphone cable, or a terminal of a microphone cable in a shared manner. A signal line from the common terminal 50 is branched into two lines which are connected to one end of the USB switch 10 and one end of the audio switch 20 which is a primary hierarchical switch of the audio signal switch, respectively. A signal line from the other end of the USB switch 10 is connected to the USB driver 210.

A signal line from the other end of the audio signal switch 20 in a primary hierarchical position is branched into a plurality of lines (two lines in the case of FIG. 4), and the respective plurality of lines (two lines in the case of FIG. 4) are connected to one ends of the headphone switch 21 and the microphone switch 22 which are secondary hierarchical switches of the audio signal switch. A signal line from the other end of the headphone switch 21 is connected to the audio circuit 1 (221), whereas a signal line from the other end of the microphone switch 22 is connected to the audio circuit 2 (222).

The bidirectional switches BSWe1 and BSWe2 of the first and second embodiments may be used for at least one of the high-frequency signal switch and the audio signal switch. Also, the bidirectional switches BSWc1 and BSWc2 of the first and second comparative examples may be used for at least one of the high-frequency signal switch and the audio signal switch. As the number of bidirectional switches of the first and second embodiments used for the switches increases, the total circuit area of the switch circuit 100 can be further reduced.

The configuration of the switch circuit 100 according to the above-described application examples achieves the following advantageous effect. That is, connecting audio signal switches hierarchically enables retaining both the quality of audio signals passing through the audio signal switches and the quality of high-frequency signals passing through the high-frequency signal switch even when there is an increase of audio circuits and/or audio wiring.

The present invention has been described based on illustrative embodiments. These embodiments are intended to be illustrative only and it will be obvious to those skilled in the art that various modifications to constituting elements and processes could be further developed and that such additional modifications are also within the scope of the present invention.

In the above-described application examples, descriptions have been given of examples where the switch circuit 100 is mounted on a mobile phone. However, this should not be considered as limiting and, for example, the switch circuit 100 may be applicable to mobile devices, such as smartphones, digital cameras, portable music players, game devices, and IC recorders, besides the mobile phones. Also, in the light of the refinement of design and the prevention of false insertion and the like, the present embodiments are applicable to not only mobile devices but also all sorts of electronic devices and equipment as long as a connector is simplified.

What is claimed is:

1. A switch circuit to be mounted in a mobile device having a shared terminal that allows insertion of a terminal of a USB cable or insertion of a terminal of a cable dedicated to the transmission of audio signals in a shared manner, comprising:
   a USB switch connected between the shared terminal and a USB driver within the mobile device;
   an audio switch connected to the shared terminal and connected in parallel with the USB switch;
   a second switch connected between the audio switch and a first audio circuit within the mobile device; and
   a third switch connected between the first audio switch and a second audio circuit within the mobile device and connected in parallel with the second switch, wherein
   each of the USB switch, the audio switch, the second switch, and the third switch is a bidirectional switch constructed by using a Metal-Oxide-Semiconductor Field-Effect Transistor (MOSFET), and a source terminal and a backgate terminal of the MOSFET are connected via a transfer gate.

2. The switch circuit according to claim 1, wherein
   the bidirectional switch includes a switch connected between a connection point of the backgate terminal and the transfer gate and a ground potential or supply potential, and when the backgate of the MOSFET is turned off, the switch is controlled to be on and the potential of the backgate terminal of the MOSFET is controlled to be the ground potential or supply potential.

3. A multi-mode switch circuit, comprising:
   a first shared bidirectional port;
   a first bidirectional switch having a first terminal connected to the first shared bidirectional port, a second terminal, and a control terminal;
   a second bidirectional switch having a first terminal connected to the first shared bidirectional port, a second terminal, and a control terminal;
   a third switch having an input terminal connected to a first terminal of the multi-mode switch circuit, a second terminal connected to the second terminal of the first bidirectional switch, and a control terminal;
   a fourth switch having a first terminal having an input terminal connected to the second terminal of the second bidirectional switch, and a second terminal connected to an output terminal of the multi-mode switch circuit; and
   a controller coupled to the control terminals of the first and second bidirectional switches and the third and fourth switches, for enabling only the first bidirectional switch in a first mode, for enabling only the second bidirectional switch and the third switch in a second mode, and for enabling only the second bidirectional switch and the fourth switch in a third mode.

4. The multi-mode switch circuit of claim 3, wherein:
   the first mode comprises a universal serial bus (USB) mode, the second mode comprises an audio headphone mode, and the third mode comprises an audio microphone mode.

5. The multi-mode switch circuit of claim 3, wherein each of the first and second bidirectional switches comprises:
   a metal-oxide-semiconductor field-effect transistor (MOSFET), wherein a source terminal and a backgate terminal of the MOSFET are connected to each other via a transfer gate.

6. The multi-mode switch circuit of claim 5, wherein the transfer gate comprises:
a first transistor of a first conductivity type having a first terminal coupled to the source terminal of the MOSFET, a gate for receiving a control signal, and a second terminal coupled to the backgate terminal of the MOSFET; and
a second transistor of a second conductivity type having a first terminal coupled to the source terminal of the MOSFET, a gate for receiving a complement of the control signal, and a second terminal coupled to the backgate terminal of the MOSFET.

7. The multi-mode switch circuit of claim 5, wherein each of the first and second bidirectional switches further comprises:
a second MOSFET connected between a connection point of the backgate terminal and the transfer gate and one of a ground potential and a supply potential, wherein when the backgate of the MOSFET is turned off, the second MOSFET is controlled to be on and the potential of the backgate terminal of the MOSFET is controlled to be the one of the ground potential and the supply potential.

8. The multi-mode switch circuit of claim 3, wherein the first shared bidirectional port, the first bidirectional switch, the second bidirectional switch, the third switch, and the fourth switch are combined on a single integrated circuit.

9. The multi-mode switch circuit of claim 3, further comprising:
a second shared bidirectional port of the multi-mode switch circuit;
a fifth switch having a first terminal for conducting a power supply voltage, a second terminal coupled to the second shared bidirectional port of the multi-mode switch circuit, and a control terminal; and
a sixth switch having a first terminal connected to the second shared bidirectional port of the multi-mode switch circuit, a second terminal coupled to the second shared bidirectional port of the multi-mode switch circuit, and a control terminal, wherein the controller enables the fifth switch in the first mode, and the sixth switch in a fourth mode.

10. A multi-mode switch apparatus comprising a switch circuit, the switch circuit comprising:
a primary hierarchical level comprising:
a first bidirectional switch having a first terminal, a second terminal, and a control terminal; and
a second bidirectional switch having a first terminal, a second terminal, and a control terminal,
a second hierarchical level comprising:
a third switch having a first terminal, a second terminal coupled to the first terminal of the second bidirectional switch, and a control terminal; and
a fourth switch having a first terminal, a second terminal coupled to the first terminal of the second bidirectional switch, and a control terminal, and
a controller for enabling only the first bidirectional switch in a first mode, only the second bidirectional switch and the third switch in a second mode, and only the second bidirectional switch and the fourth switch in a third mode.

11. The multi-mode switch apparatus of claim 10, wherein:
the first mode comprises a universal serial bus (USB) mode, the second mode comprises an audio headphone mode, and the third mode comprises an audio microphone mode.

12. The multi-mode switch apparatus of claim 10, wherein each of the first and second bidirectional switches comprises:
a metal-oxide-semiconductor field-effect transistor (MOSFET), wherein a first terminal and a backgate terminal of the MOSFET are seletively coupled to each other via a transfer gate.

13. The multi-mode switch apparatus of claim 12, wherein the MOSFET comprises an n-channel MOSFET.

14. The multi-mode switch apparatus of claim 12, wherein the transfer gate comprises:
a first transistor of a first conductivity type having a first terminal coupled to the first terminal of the MOSFET, a gate for receiving a control signal, and a second terminal coupled to the backgate terminal of the MOSFET; and
a second transistor of a second conductivity type having a first terminal coupled to the first terminal of the MOSFET, a gate for receiving a complement of the control signal, and a second terminal coupled to the backgate terminal of the MOSFET.

15. The multi-mode switch apparatus of claim 14, wherein the first conductivity type comprises n-channel, and the second conductivity type comprises p-channel.

16. The multi-mode switch apparatus of claim 12, wherein each of the first and second bidirectional switches further comprises:
a switch connected between a connection point of the backgate terminal and the transfer gate and one of a ground potential and a supply potential, wherein when the backgate of the MOSFET is turned off, the switch is controlled to be on and the potential of the backgate terminal of the MOSFET is controlled to be the one of the ground potential and the supply potential.

17. The multi-mode switch apparatus of claim 10, wherein the first bidirectional switch, the second bidirectional switch, the third switch, the fourth switch, and the controller are combined on a single integrated circuit.

18. The multi-mode switch apparatus of claim 10, further comprising:
a second shared bidirectional port of the switch circuit;
a fifth switch having a first terminal for conducting a power supply voltage, a second terminal coupled to the second shared bidirectional port of the switch circuit, and a control terminal; and
a sixth switch having a first terminal connected to the second shared bidirectional port of the switch circuit, a second terminal coupled to the second shared bidirectional port of the switch circuit, and a control terminal, wherein the controller enables the fifth switch in the first mode, and the sixth switch in a fourth mode.

19. The multi-mode switch apparatus of claim 10, further comprising:
a common connector coupled to the second terminals of each of the first and second bidirectional switches, having a plurality of external bidirectional terminals adapted to interface to a selected one of a first cable of a first type and a second cable of a second type.

20. The multi-mode switch apparatus of claim 19, wherein the first type comprises universal serial bus (USB), and the second type comprises audio.

* * * * *